US009699396B2

(12) United States Patent
Schneider et al.

(10) Patent No.: US 9,699,396 B2
(45) Date of Patent: Jul. 4, 2017

(54) SURFACE CONTACT IMAGING SENSOR

(71) Applicant: QUALCOMM Incorporated, San Diego, CA (US)

(72) Inventors: John Keith Schneider, Williamsville, NY (US); Jack Conway Kitchens, II, Tonawanda, NY (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/191,360

(22) Filed: Jun. 23, 2016

(65) Prior Publication Data

US 2016/0309108 A1      Oct. 20, 2016

Related U.S. Application Data

(63) Continuation of application No. 13/628,686, filed on Sep. 27, 2012, now Pat. No. 9,465,051.

(60) Provisional application No. 61/540,865, filed on Sep. 29, 2011.

(51) Int. Cl.
| | | |
|---|---|---|
| *G01R 27/26* | (2006.01) | |
| *H04N 5/3745* | (2011.01) | |
| *G01R 15/16* | (2006.01) | |
| *G06K 9/00* | (2006.01) | |
| *H01L 27/146* | (2006.01) | |

(52) U.S. Cl.
CPC ........... *H04N 5/3745* (2013.01); *G01R 15/16* (2013.01); *G01R 27/2605* (2013.01); *G06K 9/0002* (2013.01); *G06K 9/0008* (2013.01); *H01L 27/14612* (2013.01); *H01L 27/14643* (2013.01)

(58) Field of Classification Search
CPC .. H04N 5/3745; G06K 9/0004; G06K 9/0002; G06K 9/0008; G01R 15/16; G01R 27/2605; H01L 27/14612; H01L 27/14643
USPC ................................................ 324/658–690
See application file for complete search history.

(56) References Cited

U.S. PATENT DOCUMENTS

| | | | | |
|---|---|---|---|---|
| 4,225,850 A | * | 9/1980 | Chang ................ | G06K 9/00067 382/124 |
| 5,572,205 A | * | 11/1996 | Caldwell ............ | H03K 17/9622 200/600 |
| 7,053,633 B2 | * | 5/2006 | Hara ........................ | G01D 5/24 324/686 |
| 7,436,736 B2 | * | 10/2008 | Schneider .............. | G01H 11/06 367/170 |
| 9,465,051 B1 | | 10/2016 | Schneider | |

OTHER PUBLICATIONS

U.S. Notice of Allowance dated Mar. 24, 2016 issued in U.S. Appl. No. 13/628,686.

(Continued)

*Primary Examiner* — Farhana Hoque
(74) *Attorney, Agent, or Firm* — Weaver Austin Villeneuve & Sampson LLP

(57) ABSTRACT

An imaging system disposed on a TFT array employing a capacitance input sensing stage into a diode peak detecting circuit used as a single pixel on a semiconductor or TFT array that is capable of accessing the generated charge across the capacitor, peak detecting it, amplifying it and then distributing it to an external system via row and column addressing. The resulting imaging system is suitable for fingerprint imaging or as a computer touchpad input device.

19 Claims, 2 Drawing Sheets

(56) References Cited

OTHER PUBLICATIONS

U.S. Final Office Action dated Dec. 14, 2015, issued in U.S. Appl. No. 13/628,686.
U.S. Office Action dated Jun. 10, 2015, issued in U.S. Appl. No. 13/628,686.
U.S. Final Office Action dated Dec. 4, 2014, issued in U.S. Appl. No. 13/628,686.
U.S. Office Action dated May 6, 2014, issued in U.S. Appl. No. 13/628,686.

* cited by examiner

SURFACE CONTACT IMAGING SENSOR

CROSS-REFERENCE TO RELATED APPLICATIONS

This application is a continuation U.S. patent application Ser. No. 13/628,686, filed on Sep. 27, 2012 and claims the benefit of priority to U.S. provisional patent application Ser. No. 61/540,865, filed on Sep. 29, 2011.

FIELD OF THE INVENTION

The present invention relates to a contact imaging sensor that uses capacitance as the detection means. The imaging sensor may be suitable for fingerprint imaging, as a computer touchpad input device, or as a contact imager suitable for many purposes.

BACKGROUND OF THE INVENTION

Since the 1800's fingerprint information has been collected from human fingers and hands by applying ink to the fingers and/or hands, and then pressing or rolling on paper or card stock. For purposes of this document, the term fingerprint means the skin surface friction ridge detail of a single fingerprint, partial fingerprint or any portion of the skin surface friction ridge of up to and including the entire hand or foot.

In recent years various electronic fingerprint scanning systems have been developed utilizing optical, capacitance, direct pressure, thermal and acoustic (including ultrasound) methods. Methods based upon capacitance and acoustics have proven to be the most accurate, because they are virtually immune to the effects of grease, dirt, paint, ink and other contaminants. Capacitance sensors may offer an advantage over acoustic methods in that they may be able to offer improved imaging in cases where there is poor acoustic impedance matching between the friction skin of the fingerprint and the scanner's platen, such as may be encountered when the friction skin is very dry.

Ultrasonic scanning systems often employ a piezoelectric transducer that sends longitudinal wave energy through transmitting media. At each media interface some of the energy reflects back toward the transducer. The reflected energy is received at the transducer and may be used to measure the exact distance traveled by the pulse going and returning for each reflecting material interface. As such, it is necessary to distinguish energy reflected by the object to be imaged from energy that has been reflected by other objects. To do so, a process called range gating (biasing) may be used. The returning signal that has been identified via range gating for further processing may be converted to a digital value representing the signal strength. Graphically displaying this information creates a contour map of the object (human finger or skin surface) that is in contact with the platen surface, and the depth of any gap structure (fingerprint valleys) detail may be displayed as a gray-scale bitmap image.

The capacitance method relies on the fact that capacitance is a function of the distance between capacitance plates, i.e., the TFT (Thin Film Transistor) input pad and the skin of the finger. Since the ridges of the skin are closer to the TFT than the valleys, differing capacitance readings are produced by ridges and valleys. The use of a solid state array as the addressing and readout device for a capacitance imaging system should allow for improved reliability and speed in acquiring a high quality image.

With the invention of CCD (Charge Coupled Device) camera elements, and subsequently CMOS (Complimentary Metal-Oxide Semiconductor) imagers, solid state arrays have taken great strides. Recent developments now include x-ray TFT imagers, where TFT FET (Field Effect Transistor) elements are fabricated as an array on an insulating substrate, and then read out via computer controlled means, and used to create an image. These x-ray images rely on a photodiode to generate a charge when exposed to photonic energy, and that charge can be read out via the array to yield high resolution x-ray images.

For a capacitance imaging system, a means of generating or accumulating a charge in response to a varying distance is needed. These needs are met by the use of a dielectric material configured as a simple capacitor whose voltage is sensitive to the varying distances from the sensing surface to the skin, i.e., the ridges and valleys of the friction ridge surface. This varying charge or voltage may be provided to a peak detecting circuit at the input of an amplifier and row/column readout device, i.e., TFT or CMOS circuit.

SUMMARY OF THE INVENTION

The invention may be embodied as a sensing array for an imaging sensor. Such an array may include a capacitance transducer that changes electrical voltage in response to the varying distance between a fixed capacitor plate and a conductive object of varying surface height. The electrical charge received for a particular location is input to a pixel-level peak detector integrator, amplified, read out through a row and column addressing scheme and then reset to remove the charge when no longer needed. The pixel-level peak detector integrator can be accomplished using a circuit comprised of several FETs, a diode and a capacitive transducer and this circuit may be duplicated to form a large array which can serve as an imaging input matrix of pixels, the outlet of which can be used to create an image of an object, such as a fingerprint, stylus or other object. Since the sensing circuit elements for the capacitive scanner includes the elements of a capacitor, this invention may be exploited and used to capture information suitable for creating an image by using the capacitance variations observed across the finger skin surface (e.g., ridges, valleys and sweat pores of the skin surface), or a stylus, or other contacting object.

In one such sensor there is a capacitance sensor pixel element array having a plurality of capacitance transducers, peak detectors and charge amplifiers. The capacitance transducers may be arranged as an array that accumulates charges in response to varying location of the outer capacitor surface, which is provided by the object to be imaged. The capacitance transducer array may include a polymer or copolymer with dielectric qualities.

The peak detectors may be part of a circuit that tracks the maximum charge available from the capacitance transducer array. The charge amplifiers may collect and amplify the charge collected by the peak detector part of the transducer array. The peak detection and charge amplification activities may be local to each pixel on the transducer array. Alternatively, the peak detection and charge amplification activities may not be local to each pixel on the transducer array, but instead may be common to many of the pixels, and in that case the charge may be directed to the peak detection and charge amplification circuits by means of row and column addressing circuits that are part of the transducer array.

The capacitance transducers may have (a) a first conductor positioned on a TFT amplifier input and defining a first plate of the capacitance transducer, and (b) a second conductor common to all of the capacitance transducers of the array and disposed over a dielectric insulating layer, and defining a second plate of the capacitance transducer, wherein the first and second conductors are spaced apart from each other. The capacitance transducers may further include (i) a dielectric insulating layer between the first conductor and the second conductor, (ii) a biasing voltage source providing an input voltage, and (iii) an amplifier having an input and an output, the input being coupled to a reference voltage and the first conductor.

BRIEF DESCRIPTION OF THE FIGURES

The invention will now be described by way of a non-limiting example, with reference to the attached drawings and diagrams in which.

FURTHER DESCRIPTION OF THE INVENTION

Figure 2:
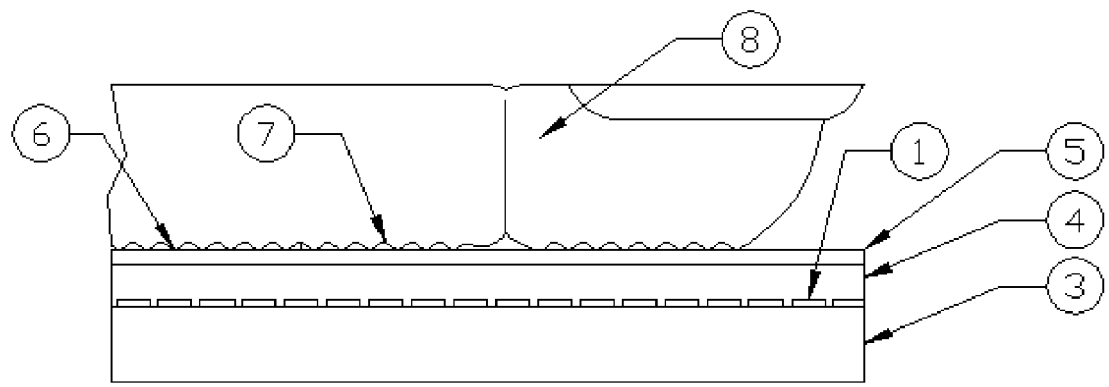
FIG. 2 is a diagram of a device that is in keeping with the invention.

FIG. 2 shows a cross section of an embodiment of a device according to the invention. In operation, the TFT sensor 3 (which may include an array of small multi-transistor peak detectors and charge amplifiers) is used to collect and amplify the charges resulting from the capacitors formed by the electrodes 1, dielectric layer 4 and finger 8. The capacitor dielectric layer 4 or the biasing electrode 5 is contacted by an object having slight electrical conductivity, e.g., a finger 8. If a valley 7 of the finger 8 is presented to a particular receiver electrode 1, the charge across the associated capacitor is less than the charge across a ridge 6 of the finger 8. The charge on each electrode 1 is detected and read out of the sensor 3 to provide information which can be used to create a digital representation of the contacting object, which in FIG. 2 is a fingerprint. Each capacitor of the sensor 3 will exhibit a capacitance value based on the distance from the receiver electrode 1 to the friction skin of the finger 8. Ridges will be closer and valleys will be farther from the array of receiver electrodes 1. Biasing electrode 5 may be used to provide a DC offset to the capacitance circuit for the purpose of biasing the TFT transistors to a suitable operating point for proper operation.

Figure 1:
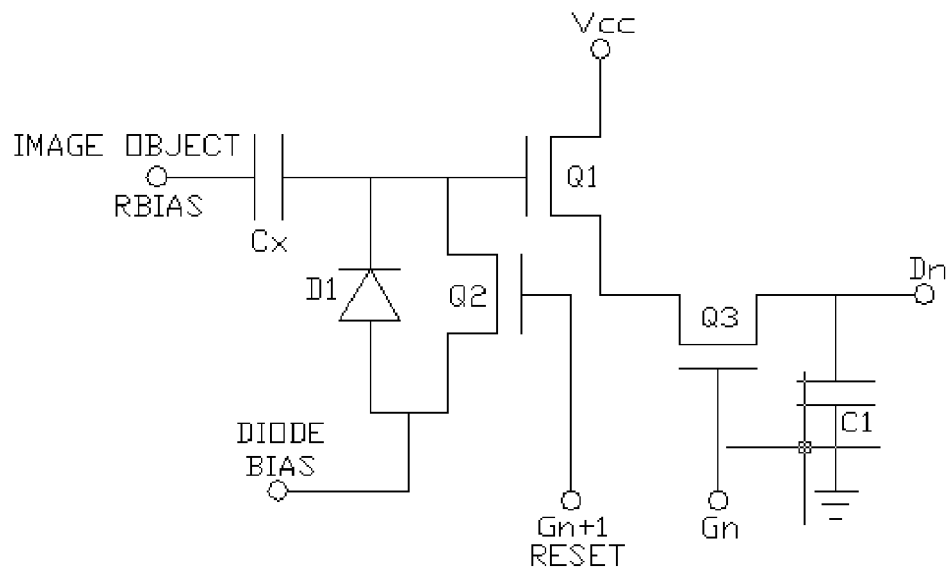
FIG. 1 is a schematic diagram of a single capacitance pixel circuit according to the invention.

Details of a capacitance receiver layer 4 are now provided. Referring to FIG. 1, the circuit elements shown are the capacitance transducer Cx, the peak detector diode D1, the reset FET Q1, the input/amplification FET Q2, and the pixel (row/column) readout FET Q3. The capacitor C1, is parasitic capacitance from the various circuit components, lines and traces. The supply voltage is applied to Vcc. Row and column addressing is achieved through the row control line Gn, and column readout is through the column readout line Dn. A voltage applied to Gn+1 (RESET) is used to reset the peak detector circuit by shorting it through the FET Q2. The control line RBIAS, is used to apply a voltage that turns on and biases the transistor Q1, to a preferred operating point on its operating curve. In a similar manner, a voltage applied via the DIODE BIAS line will turn on and bias the peak detector diode D1, to an optimum position on its operating curve so that it is optimally configured for functioning in the peak detector circuit that is made up of the diode D1, and the capacitance of the sensing capacitor (transducer) Cx.

In operation, RBIAS is raised to turn on the amplifier Q1, DIODE BIAS is applied to turn on D1, and RBIAS is biased to put an initial charge across the plates of the sensing capacitor Cx. When an object, such as a finger, is placed in position so that the finger becomes one of the plates of Cx shown in FIG. 1, the voltage across Cx changes. The voltage is peak detected by D1 and, when needed, is read by Q1. Control signals applied to Dn and Gn turn on and read out the output of Q1 using Q3. Once read out, the output may go through A/D conversion for use in constructing the image representation of all of the pixels in the array. When the charge at the peak detector has been read out and is no longer needed, RBIAS and DIODE BIAS are returned to their non-active levels and a reset signal is applied to Gn+1 (RESET) to remove any accumulated charge so that the system is ready to take the next series of capacitance readings.

Figure 3:
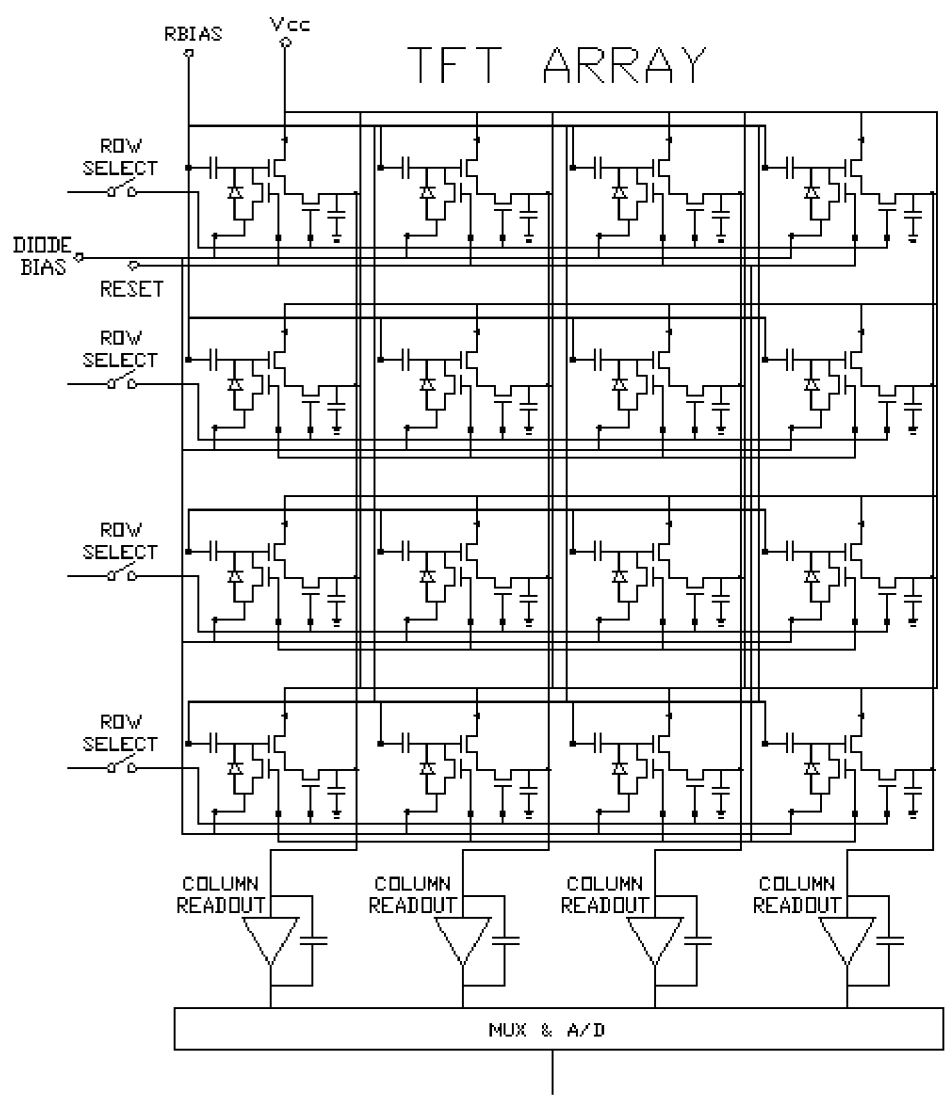
FIG. 3 is a diagram showing a schematic of a layout of a TFT circuit for a capacitance sensor according to the invention.

FIG. 3 shows the same pixel circuit as in FIG. 1, but replicated into an array of rows and columns. It should be noted that the number of rows and columns is not limited to the simple 4×4 architecture shown in FIG. 3.

It is recognized that the capacitance pixel circuit described herein is suitable for applications using TFT technology, CMOS technology or many other similar technologies, and is not limited to just FETs. For example, the array may be implemented with BJTs (Bipolar Junction Transistors) and other transistor types.

It is further recognized that the characteristics of each transistor and diode on a typical array may differ slightly from its neighbors. This will cause a condition where the operating points are not the same, and this could negatively impact the system's ability to properly assess the distance between the object being imaged and the TFT sensor 3. This is typical of imaging circuits and a typical array response will need to be mapped for both individual pixel offset and gain, a state known as fixed pattern offset and gain. Since this fixed pattern offset and gain is a characteristic of the pixel array, it can be applied to the raw output of the array to normalize the output of the pixel circuits in order to correct for differences in the receivers.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. An apparatus comprising:
    an imaging sensor including an array of pixels, the pixels arranged in rows and columns and each of the pixels comprising a capacitance transducer that includes a receiver electrode and a dielectric layer; wherein
    the capacitance transducer of at least one of the pixels includes a TFT input coupled to a reference voltage and the receiver electrode;
    a first surface of the dielectric layer directly contacts the receiver electrode;
    a second surface of the dielectric layer, opposite to the first surface, is configured to be coupled with an object to be imaged;
    the receiver electrode is operatively coupled with the TFT input and defines a first plate of the capacitance transducer;

the object to be imaged, when coupled with the dielectric layer, defines a second plate of the capacitance transducer;

a voltage of each capacitance transducer is sensitive to a distance between the first plate and a proximal portion of a surface of the object to be imaged; and the at least one of the pixels includes (i) a peak detecting circuit electrically connected to the receiver electrode to detect a maximum charge available from the capacitance transducer and (ii) one or more charge amplifiers to collect and amplify the charges detected by the peak detecting circuit.

2. The apparatus of claim 1 where the dielectric layer includes a polymer or copolymer with dielectric qualities.

3. The apparatus of claim 1, wherein:

the array of pixels includes peak detectors and charge amplifiers, and the capacitance transducers are configured to accumulate charges in response to varying distances of a contoured surface of the object to be imaged.

4. The apparatus of claim 3 wherein the peak detectors and charge amplifiers are each local to a respective pixel on the transducer array.

5. The apparatus of claim 3 wherein each peak detector and charge amplifier is common to a respective plurality of the pixels.

6. The apparatus of claim 5, wherein the maximum charge is directed to the peak detection and charge amplification circuits by means of row and column addressing circuits that are part of the array of pixels.

7. The apparatus of claim 1, further comprising a row/column reader to produce a contour map of the object to be imaged.

8. The apparatus of claim 1, further comprising a platen disposed between the dielectric layer and the object to be imaged.

9. The apparatus of claim 1, wherein an input of the TFT amplifier is coupled with a biasing voltage source providing an input voltage to the input of the TFT amplifier.

10. The apparatus of claim 9, wherein the biasing voltage source is coupled with a biasing electrode disposed between the dielectric layer and the object to be imaged.

11. The apparatus of claim 1, further comprising a platen disposed between the dielectric layer and the object to be imaged.

12. An apparatus comprising an imaging sensor including an array of pixels, the pixels arranged in rows and columns and each of the pixels comprising a capacitance transducer that includes a receiver electrode and a dielectric layer; wherein the capacitance transducer of at least one of the pixels includes a TFT input coupled to a reference voltage and the receiver electrode;

a first surface of the dielectric layer directly contacts the receiver electrode;

a second surface of the dielectric layer, opposite to the first surface, is configured to be coupled with an object to be imaged;

the receiver electrode is operatively coupled with a TFT amplifier input and defines a first plate of the capacitance transducer;

the object to be imaged, when coupled with the dielectric layer, defines a second plate of the capacitance transducer;

a voltage of each capacitance transducer is sensitive to a distance between the first plate and a proximal portion of a surface of the object to be imaged; and the at least one of the pixels includes (i) a peak detecting circuit electrically connected to the receiver electrode to detect a maximum charge available from the capacitance transducer and (ii) one or more charge amplifiers to collect and amplify the charges detected by the peak detecting circuit; and means for producing a contour map of the object to be imaged from the voltage of each capacitance transducer.

13. The apparatus of claim 12 wherein the dielectric layer includes a polymer or copolymer with dielectric qualities.

14. The apparatus of claim 12, wherein:

the array of pixels includes peak detectors and charge amplifiers, and the capacitance transducers are configured to accumulate charges in response to varying distances of a contoured surface of the object to be imaged.

15. The apparatus of claim 14 wherein the peak detectors and charge amplifiers are each local to a respective pixel on the transducer array.

16. The apparatus of claim 14 wherein each peak detector and charge amplifier is common to a respective plurality of the pixels.

17. The apparatus of claim 16, wherein the maximum charge is directed to the peak detection and charge amplification circuits by means of row and column addressing circuits that are part of the array of pixels.

18. The apparatus of claim 12, wherein an input of the TFT amplifier is coupled with a biasing voltage source providing an input voltage to the input of the TFT amplifier.

19. The apparatus of claim 18, wherein the biasing voltage source is coupled with a biasing electrode disposed between the dielectric layer and the object to be imaged.

* * * * *